United States Patent [19]
Fritsche

[11] Patent Number: 5,540,823
[45] Date of Patent: Jul. 30, 1996

[54] MAGNETRON CATHODE

[75] Inventor: Wolf-Eckart Fritsche, Kleinostheim, Germany

[73] Assignee: Leybold Aktiengesellschaft, Hanau, Germany

[21] Appl. No.: 864,177

[22] Filed: Apr. 3, 1992

Related U.S. Application Data

[63] Continuation of Ser. No. 612,630, Nov. 13, 1990, abandoned.

[30]    Foreign Application Priority Data

Aug. 8, 1990 [DE] Germany .................. 40 25 077.6

[51] Int. Cl.[6] .................................. C23C 14/34
[52] U.S. Cl. .................. 204/298.19; 204/298.11; 204/298.12; 204/192.12
[58] Field of Search ............... 204/298.02, 298.09, 204/298.11, 298.12, 298.16, 298.17, 298.19

[56]    References Cited

U.S. PATENT DOCUMENTS

| | | | |
|---|---|---|---|
| 4,169,031 | 9/1979 | Brors | 204/298.19 X |
| 4,200,510 | 4/1980 | O'Connell et al. | 204/298.19 X |
| 4,407,707 | 10/1983 | Landau | 204/298.19 X |
| 4,434,042 | 2/1984 | Keith | 204/298.19 X |
| 4,448,653 | 5/1984 | Wegmann | 204/298.19 X |
| 4,486,287 | 12/1984 | Fournier | 204/298.12 X |
| 4,500,409 | 2/1985 | Boys et al. | 204/298.19 X |
| 4,515,675 | 5/1985 | Kieser et al. | 204/298.19 X |
| 4,747,927 | 5/1988 | Rille et al. | 204/298.12 |
| 4,933,064 | 6/1990 | Geisler et al. | 204/298.17 |

*Primary Examiner*—Nam Nguyen
*Attorney, Agent, or Firm*—Felfe & Lynch

[57]    ABSTRACT

A magnetron cathode for a cathode sputtering system has a target holder for holding a target 9 where the erosion zone is opposite the substrate. The non-sputtering target surfaces 9a are covered with a barrier layer or protective layer 21.

5 Claims, 3 Drawing Sheets

MAGNETRON CATHODE

This application is a continuation of application Ser. No. 07/612,630, filed Nov. 13, 1990, now abandoned.

BACKGROUND OF THE INVENTION

The invention relates to a magnetron cathode for a cathode sputtering system for reactive sputtering including a target holder for holding a target where the erosion zone is located opposite a substrate and including a magnet system which has a pole shoe and a yoke. The magnetic flux lines penetrate the target and in the discharge chamber, the electric flux lines are superimposed thereon so that the electrons are concentrated directly before the target.

A magnetron cathode for a cathode sputtering system of the aforesaid kind which has a target holder for a target where the erosion zone is opposite a substrate is known. The corresponding magnet system has a pole shoe and a yoke and the magnetic flux lines penetrate the target. In the discharge chamber, the electric flux lines are superimposed so that the electrons are concentrated directly before the target. A reactive sputtering with aggressive reactive gases may cause arcing problems so that, by reaction, non-sputtering target surfaces are gradually covered by a dielectric layer. Particularly in case of ZPT cathodes, it is possible that the target surface is converted, in particular at those surface parts which are opposite the floating magnet shield.

SUMMARY OF THE INVENTION

It is an object of the invention to configure the target surface at critical points such that formation of dielectric layers is avoided.

This object has been accomplished in that the non-sputtering target surfaces are coated with a barrier layer or a protective layer. The non-sputtering surfaces with the protective layer are advantageously located opposite the floating magnet shield. In this respect, it is advantageous that the non-sputtering target surface be covered with a an electrically conductive, in particular a metallic protective layer. If these surfaces are covered with a metallic layer which reacts only gradually or not at all with the reactive gas or remains largely conductive despite the reaction, these arcing problems can be prevented or greatly reduced. Since these target surfaces do not participate in the sputtering, no foreign atoms will enter the layer on the substrate.

It is particularly advantageous that the protective layer applied onto the non-sputtering target surface be one of copper oxide or zinc oxide and that the protective layer be provided only on the outer sides of the target. The barrier layer can either be conductive or be a non-oxidizing layer. In both cases it fulfills its task in simple manner and prevents a dielectric layer from being deposited on the non-sputtering target surface. This also prevents charge-carrying particles from breaking through the layer. The breaking through of the layer depends, inter alia, from the electric field and the layer density. In the arrangement described, the electric field can have approximately $10^{11}$ volt/m. It is difficult to maintain such a field strength when the layer does not become conductive.

DETAILED DESCRIPTION OF THE PREFERRED EMBODIMENT

Figure 1:
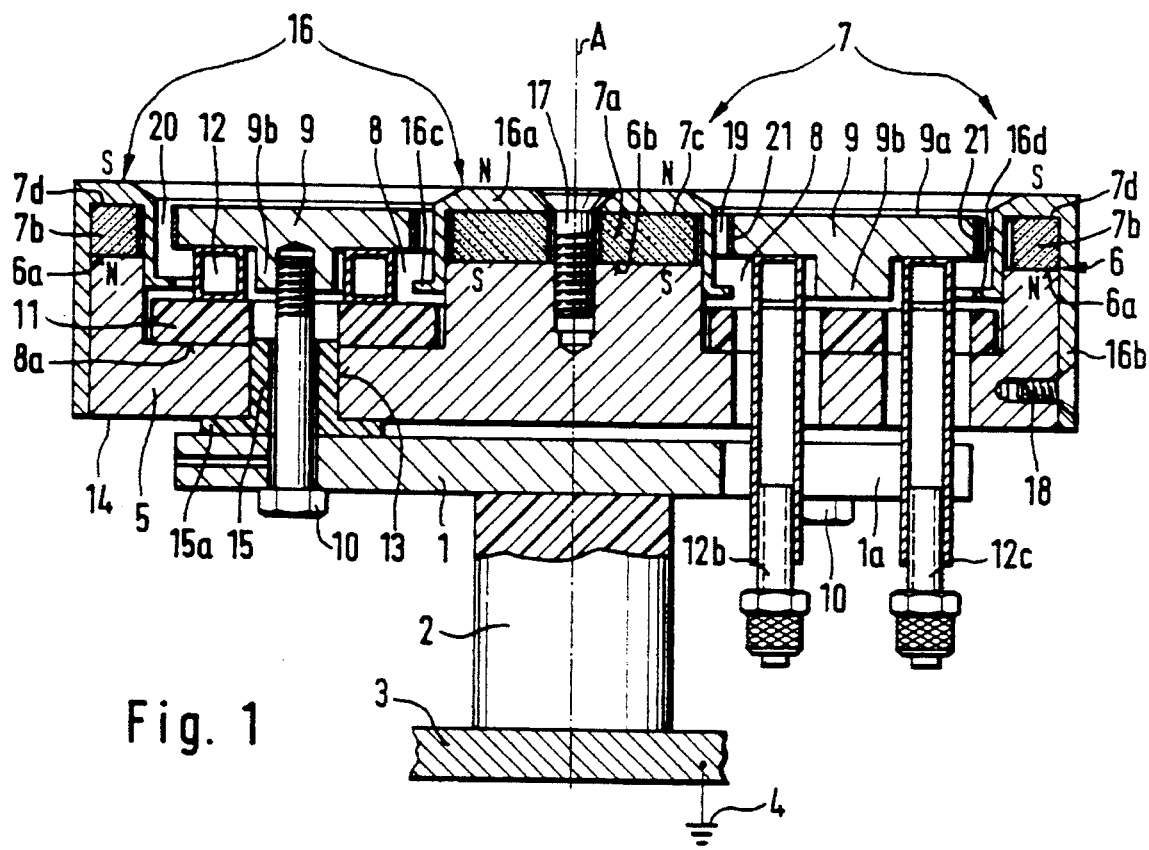
FIG. 1 is section of a round magnetron.

FIG. 1 shows a power supply plate 1 which is connected to a vacuum chamber 3 via a pedestal-type insulator 2. The vacuum chamber in turn is connected to ground 4. A magnet yoke 5 is connected to the power supply plate 1 in an insulated but tight manner. On its top side, the magnet yoke 5 has a flat surface 6 with annularly closed support surfaces 6a and 6b for a magnet arrangement 7. The magnet system 7 comprises a inner ring magnet 7a and a closed outer row of bar magnets 7b all of which are axially magnetized with respect to axis A of the system. The direction of the polarity of the inner ring magnet 7a is opposite that of the outer bar magnets 7b. The pole position is expressly included in FIG. 1. On the side facing away from the magnet yoke 5, the magnet system 7 has pole surfaces 7c and 7d which are located on a common plane.

Figure 5:
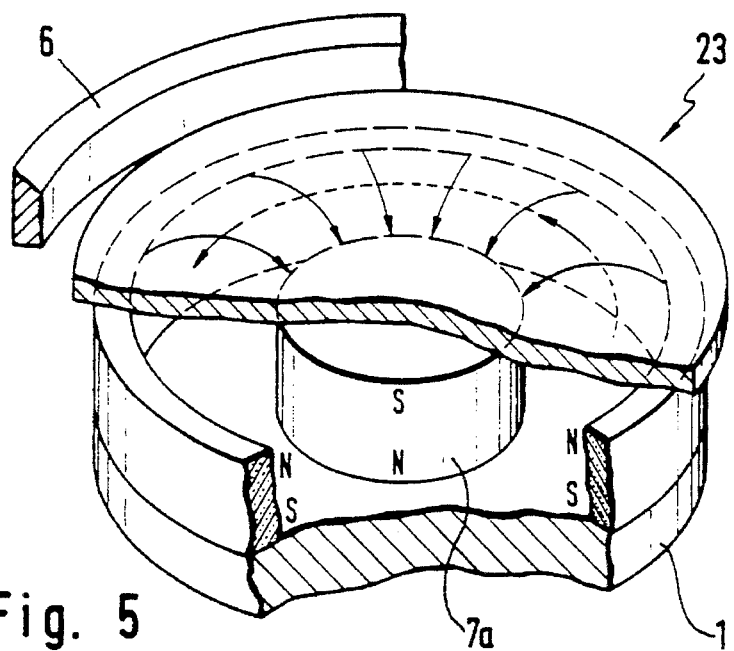
FIG. 5 is a perspective view of the magnetron of FIG. 1.

The principle and the course of the magnetic flux lines are principally illustrated in FIG. 5.

Figure 6:
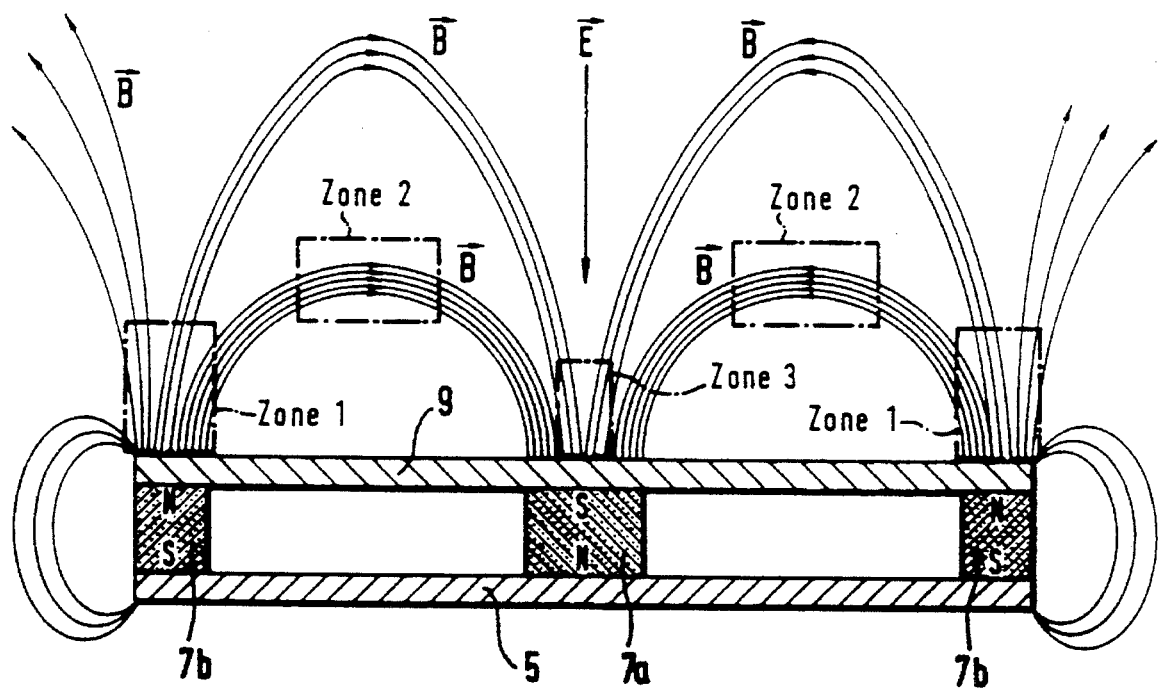
FIG. 6 shows the curve of the flux lines in a magnet arrangement.

FIG. 6 is a section across the magnet arrangement with an ideal course of the flux lines and the direction of the electric field. The various zones of the course of the flux lines are indicated in FIG. 6 by boxes. These areas are of particular interest for the movement of charged particles and especially for the movement of electrons in the arrangement. In the course of the description, these zones are only discussed with respect to the movement of the electrons since only they affect the ionization of the inert gas and hence, the operation of the magnetron.

In zone 1, there applies $E_{\parallel}B$. This means, the flux lines of the electric and the magnetic fields have only components which are directed in an opposite parallel sense. An electron that starts from the cathode toward this area, will follow a helical line around the magnetic flux line. The effect of the electric field can be noticed from an increased pitch in the helical line. The magnetic flux lines start to bend at some distance away from the cathode resulting in a horizontal component which runs perpendicular the electric field component. The horizontal component will cause an E×B drift of the electron. At the same time, due to the arcing of the magnetic flux line, an arcing drift affects the electron.

For an electron, the directions of the arcing drifts are the same, they add up to a total drift. For particles that start in zone 1 on the right half of the target, the direction of drift points into the plane of the paper. On the left half of the target in zone 1, the drift points out of the plane of the paper. The curve described by the electron is a superimposition of helical line and drift. In its movement, the electron follows the arc of the magnetic flux lines. The helical line describes an increasingly larger radius and with the horizontal component increasing, it assumes a cycloidal shape. When the vertical component has the value zero, the electron follows the curve of an actual cycloid; it can be found in zone 2. Electrons which are affected from the magnetic flux lines leading away from the magnetron will drift out of the arrangement and go to the anode.

In zone 2, there applies $E \perp B$. This means, the electric flux lines stand perpendicular on the magnetic flux lines. The electric drift (E×B) has a maximum value in this zone. Electrons starting from a quiescent position will follow an elongated cycloid. Due to the curve of the cycloid, there is a long residence time of the electrons in this zone which in turn increases the probability that the atoms of the inert gas are ionized. Due to the increased ionization, there will also be in increased sputtering of the cathode in this area, the erosion zone.

In zone 3, there applies E₋₊B. This means, the components of the flux lines of the electric and magnetic fields are oriented in the same direction and parallel. In this area close to the cathode, there are only components running perpendicular to the surface. Electrons starting in zone 3 will describe a course that is identical to the one of electrons starting in zone 1. Due to the fact, that the magnetic flux lines are oriented in the same direction as the electric flux lines, and not in an opposite sense as in zone 1, the turning direction of the helical lines will be reversed.

Between the support surfaces 6a and 6b and between the pole surfaces 7c and 7d, there is an annularly closed, trough-like recess 8 extending into the magnetic yoke 5 and which has an essentially rectangular cross section. This recess accommodates an annular target 9. The target surface 9a thereof is flat and in a common plane with the pole surfaces 7c and 7d. However, it is very advantageous to arrange the pole surfaces 7c and 7d above the target surface 9a by correspondingly selecting the thickness of the insulating body 11.

The recess 8 has a flat bottom 8a with a plate-like insulating body 11 resting thereon. The body essentially fills the entire width of the recess 8.

The rear side of target 9, which is made of a ferromagnetic material, is provided with a circumferential rib 9b. Inserted therein and distributed over the circumference are threads for several draw-in bolts 10. These draw-in bolts allow the target 9 to be braced with respect to the magnetic yoke 5 and the power supply plate 1.

Figure 3:
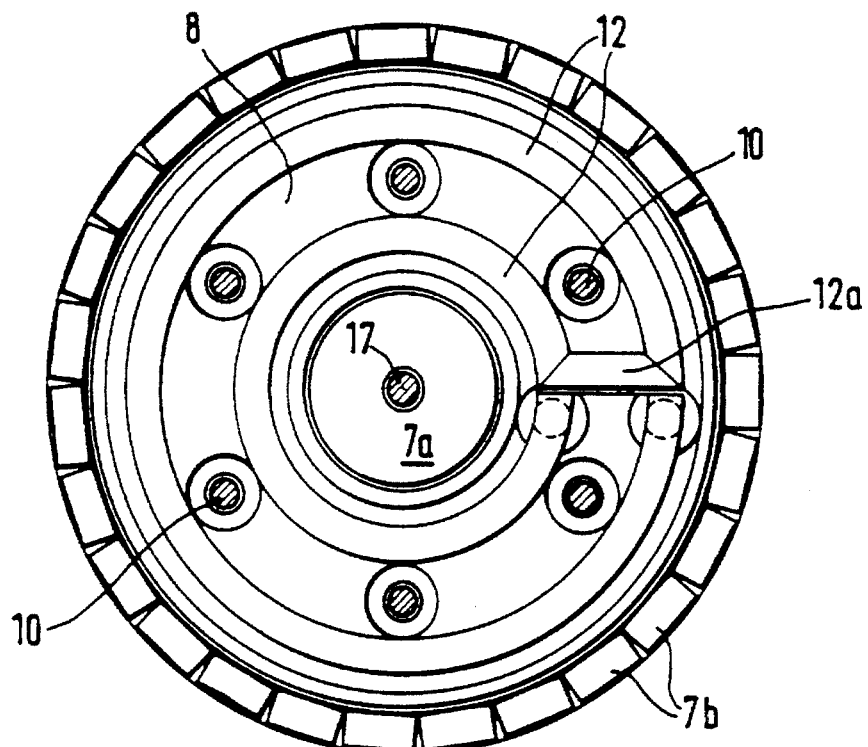
FIG. 3 is a top view of the magnetron cathode of FIG. 1.
Figure 4:
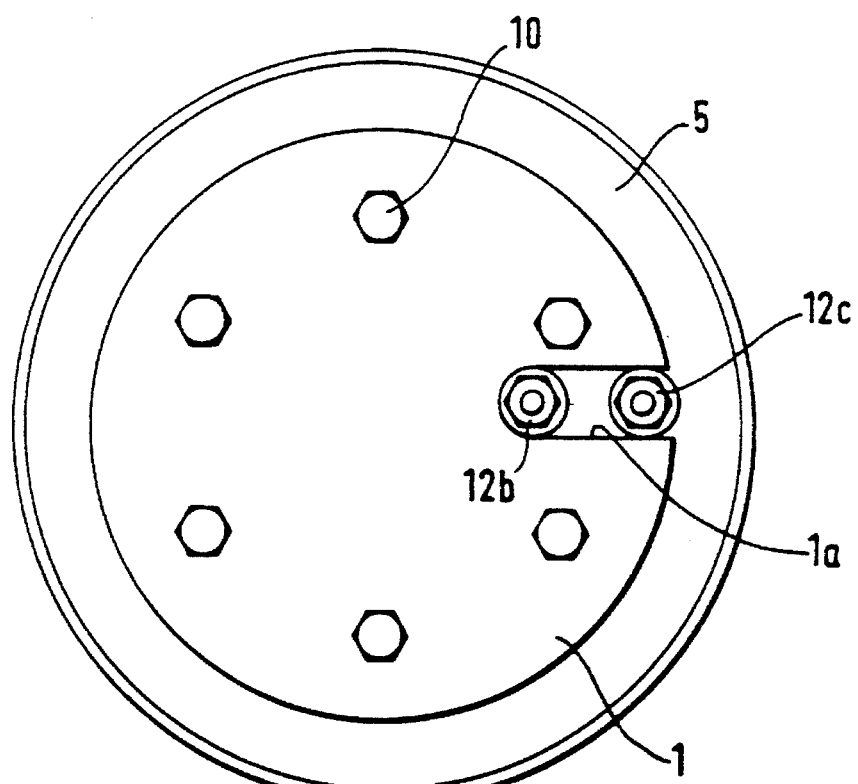
FIG. 4 is a bottom view of the magnetron cathode of FIG. 1.

Between target 9 and insulating body 11, there is a target cooling system 12 which can be configured in the form of a pipe wound in a bifilar manner and located on two different radii. The pipe can have a square-like or a rectangular cross section, and the axes of the individual windings are located in a common plane. The two windings are connected by means of a radial, mitred pipe segment 12a (FIG. 3). Perpendicular thereto, the opposite ends 12b and 12c form a right angle. At sufficient insulating distances, they pass through not-represented bores in the magnet yoke 5 and through a radial recess in the power supply plate 1.

When the draw-in bolts are tightened, the target 9 rests on the target cooling system 12 and supports the latter on the insulating body 11 and on the bottom 8a of the recess 8.

As seen in FIG. 1, a bore 13 runs from bottom 8a of the trough-like recess 8 to the opposite flat surface 14 of the magnetic yoke 5. The bore 13 represented in FIG. 1 represents a total of six draw-in bolts all which are conductively connected to the target 9, on the one hand, and conductively connected to the power supply plate 1, on the other hand.

In order to avoid a short circuit between the power supply plate 1 with the draw-in bolts 10 and the magnet yoke 5, a sleeve-like insulating body 15 is disposed in the bore 13. Outside this bore 13 and resting on the flat surface 14, this insulating body has a collar 15a. Due to the force of the draw-in bolt 10, the power supply board 1 rests on this collar.

It can be seen that the power supply plate 1 with the target 9 is thus electrically insulated with respect to both the magnet yoke 5 with the magnet arrangement 7 and vacuum chamber 3 with ground 4. Whereas the target 9, via the power supply plate 1, can be brought to a defined negative potential, and whereas ground 4 also has a defined (zero potential), the magnet arrangement 7 with the magnet yoke 5 is free and can adjust itself to an intermediate potential prescribed by the operating conditions. When this potential is reached, an action suppressing the sputtering of magnet arrangement 7 will independently take effect within a shortest possible time.

In the present case, the draw-in bolts can be referred to as target holders. While it is possible to directly anchor the draw-in bolts 10 in the metallic material of the target 9, non-metallic targets, e.g. soft-metallic parts, can be sputtered such that a metallic ring is disposed in the recess 8 onto which the soft-metallic target material is mounted. This metallic ring then functions as a good thermally conductive connection to the target cooling system 12. Moreover, it compensates mechanical forces which a brittle, dielectric target could not compensate.

It can also be seen from FIG. 1 that the magnet arrangement is accommodated in a housing 16 made of a non-ferromagnetic material. The housing 16 includes two rotationally balanced parts, one being a pot-like central housing part 16a which covers the annular magnet 7a and is braced with the magnet yoke by means of a screw 17 and the other being an annular outer housing part 16b which, in a cross sectional view, surrounds the bar magnets in an endless, i.e. closed, row. Several screws 18, of which only one is represented, serve to secure the magnet yoke.

Further, it can be seen that, starting on the plane in which there are the pole surfaces 7c and 7d, both parts 16a and 16b of the housing are configured so as to extend into the recess. In the form of two cylindrical brackets, they cover the cylindrical inner surface and the cylindrical outer surface of the target 9 with two annular air gaps 19 and 20 remaining. These bracket-like parts of the housing 16 can be considered a part of the air gaps 19 and 20 since they are made of a non-ferromagnetic material.

In the area of each of their edges, the two inner housing parts 16a and 16b have a flange-like projection 16c and 16d parallel to the target surface 9a or the plane thereof. Each of these flange-like projections covers the plate-like insulating body 11 in the area of its inner and outer edges so far that the insulating body is not visible through the air gaps 19 and 20 between the target 9 and the halves 16a and 16b of the housing. In case of a back-sputtering, no conductive material can thus be deposited on the insulating body 11 and impair the insulating properties. One must take into consideration that the available distances are relatively small so that the insulating properties must be largely maintained even over longer periods of operation.

Figure 2:
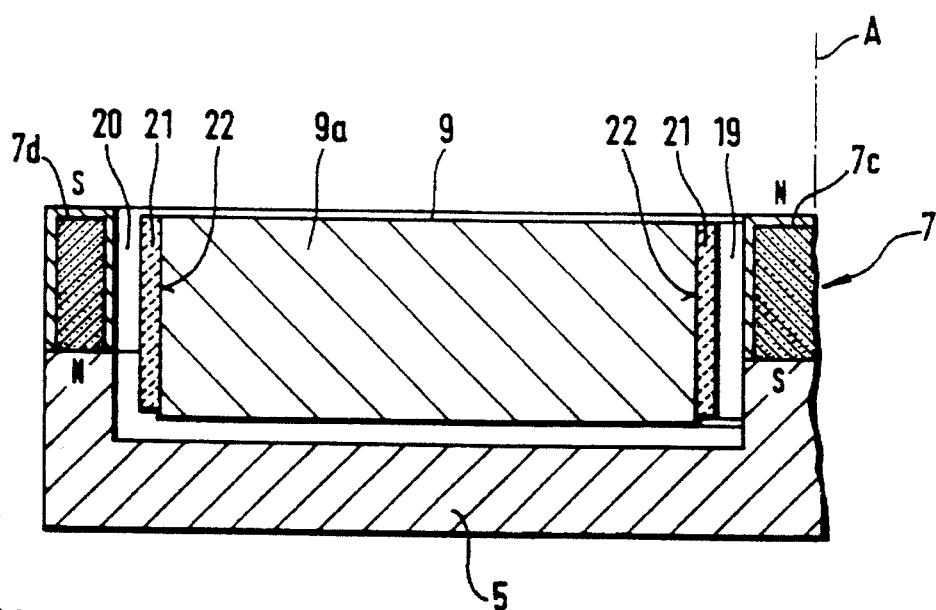
FIG. 2 is a diagrammatic representation of a target in a recess.

It is, however, possible that arcing problems occur during sputtering with aggressive reactive gases so that non-sputtering target surfaces by reaction are gradually covered with a dielectric layer. Particularly in the case of ZPT cathode, this may lead to a conversion of the target surface, especially at surface portions that are opposite the floating magnet shield. For this purpose, it is particularly advantageous when the non-sputtering target surfaces 22 are covered with a barrier layer or a protective layer. The protective layer may be opposite the floating magnet shield. It is, for example, possible to configure the protective layer so as to be non-conductive or such that it does not lose its conductivity during the sputtering. Further, it is possible to configure the protective layer applied onto the non-sputtering target surface 22 as copper oxide or zinc oxide. As seen in FIG. 2, the protective layer is provided only at critical spots on the non-sputtering sides, i.e. on the outer sides of target 9.

A particular advantage of the housing 16 resides in that its two parts 16a and 16b provide a clean end of the connecting parts of the magnet arrangement 7 with the magnet yoke 5, keeping the magnets 7a and 7b in their positions even without the use of an adhesive agent. This is of particular importance with respect to the arrangement of the outer bar magnets 7b which, due to their annular arrangement, surround the consequently wedge-like gaps in between.

If the surfaces 22 are covered with a metallic layer 21 which reacts only slowly or not at all with the reactive gas or remains conductive despite a reaction, these arcing problems can be prevented or greatly reduced. Since these target surfaces do not participate in the sputtering, no foreign atoms will enter the layer on the substrate.

The subject matter of the invention is by no means restricted to the largely rotationally balanced arrangement represented in FIGS. 1 to 3. With a particular advantage, it can also be used with elongated rectangular cathodes not represented in the drawing as they are used for the coating of large window panes, for example. At a width of approximately 30 to 40 cm, cathodes of this kind can reach a length of approximately 4 m. Any other form between a circle and a rectangle is also possible. FIG. 5 shows a round magnetron 23.

I claim:

1. Magnetron cathode for a cathode sputtering system for reactively sputtering a target in order to coat a substrate situated opposite said target, comprising inner and outer magnet means having pole faces for producing a closed tunnel of magnetic flux lines, magnetic yoke means connecting said inner and outer magnet means to define a trough-like recess opposite said tunnel and to complete a path for said flux lines, housings of non-ferromagnetic material which extend over each of said inner and outer magnet means, a target situated in said trough-like recess between said inner and outer magnet means so that said tunnel extends wholly over said target, said target having non-sputtering surfaces facing said magnet means, said non-sputtering surfaces each having thereon an electrically conductive protective layer which is confined to said non-sputtering surfaces and which remains electrically conductive during sputtering in the presence of a reactive gas, each said protective layer and housing defining an air gap therebetween, said target being electrically insulated from said magnet means, said yoke, and said housings.

2. Magnetron cathode as in claim 1 further comprising power supply means connected to said target to bring said target to a defined negative potential.

3. Magnetron cathode as in claim 2 wherein each said housing is insulated from ground potential and has a self-adjusting potential intermediate the defined negative potential of the target and ground potential.

4. Magnetron cathode as in claim 1 wherein said target comprises a sputtering surface substantially parallel to said pole faces, said non-sputtering surfaces with said protective layer being substantially perpendicular to said pole faces.

5. Magnetron cathode as in claim 1 wherein said protective layer is a metal.

* * * * *